United States Patent
Wang

(10) Patent No.: US 11,688,313 B2
(45) Date of Patent: Jun. 27, 2023

(54) DISPLAY DEVICE AND METHOD OF DETECTING DRIVING CIRCUIT

(71) Applicant: WUHAN CHINA STAR OPTOELECTRONICS SEMICONDUCTOR DISPLAY TECHNOLOGY CO., LTD., Hubei (CN)

(72) Inventor: Chaohuan Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 504 days.

(21) Appl. No.: 16/975,122

(22) PCT Filed: Jun. 28, 2020

(86) PCT No.: PCT/CN2020/098628
§ 371 (c)(1),
(2) Date: Aug. 22, 2020

(87) PCT Pub. No.: WO2021/248575
PCT Pub. Date: Dec. 16, 2021

(65) Prior Publication Data
US 2023/0123476 A1  Apr. 20, 2023

(30) Foreign Application Priority Data
Jun. 11, 2020 (CN) .......................... 202010527623.X

(51) Int. Cl.
*G09G 3/00* (2006.01)
*H01L 27/12* (2006.01)

(52) U.S. Cl.
CPC ............. *G09G 3/006* (2013.01); *G09G 3/035* (2020.08); *H01L 27/124* (2013.01); *G09G 2310/0264* (2013.01); *G09G 2330/12* (2013.01)

(58) Field of Classification Search
CPC ................... G09G 3/006; G09G 3/035; G09G 2310/0264; G09G 2330/12; G09G 3/00;
(Continued)

(56) References Cited

U.S. PATENT DOCUMENTS

2018/0053471 A1  2/2018  Lin et al.
2018/0083194 A1*  3/2018  Lee .......................... H10K 71/00
(Continued)

FOREIGN PATENT DOCUMENTS

CN  105096780 A  11/2015
CN  106814490 A  6/2017
(Continued)

OTHER PUBLICATIONS

Machine Translation of CN-108565278 IP.com (Year: 2018).*

*Primary Examiner* — Pegeman Karimi

(57) ABSTRACT

The present disclosure provides a display device and a method of detecting a driving circuit. The display device of the present disclosure is provided with test switches on both first connection wires and second connection wires, so that wiring on both sides of the driving circuit can be tested, thereby preventing the driving circuit of the display device from missed detections and improving durability of the display device.

20 Claims, 3 Drawing Sheets

(58) Field of Classification Search
CPC .............. G09G 3/03; G09G 2310/02; G09G 2310/0267; H01L 27/124; G06F 11/321
See application file for complete search history.

(56) References Cited

U.S. PATENT DOCUMENTS

| | | | |
|---|---|---|---|
| 2019/0195940 A1 | 6/2019 | Chen | |
| 2019/0311662 A1* | 10/2019 | Kim | .................. G09G 3/2007 |
| 2019/0392741 A1* | 12/2019 | Cho | .................. G09G 3/3225 |
| 2020/0234619 A1* | 7/2020 | Dai | .................. G09G 3/006 |
| 2021/0020082 A1 | 1/2021 | Wang | |
| 2021/0020085 A1* | 1/2021 | Lin | .................. G09G 3/006 |

FOREIGN PATENT DOCUMENTS

| | | | |
|---|---|---|---|
| CN | 107749269 A | | 3/2018 |
| CN | 108109566 A | | 6/2018 |
| CN | 108565278 A | * | 9/2018 |
| CN | 109410852 A | | 3/2019 |
| CN | 110322819 A | | 10/2019 |
| CN | 110676268 A | | 1/2020 |
| CN | 110853558 A | | 2/2020 |
| CN | 110867139 A | | 3/2020 |
| KR | 20120076900 A | | 7/2012 |

* cited by examiner

DISPLAY DEVICE AND METHOD OF DETECTING DRIVING CIRCUIT

FIELD OF INVENTION

The present disclosure relates to the field of display technology, in particular to a display device and a method of detecting a driving circuit.

BACKGROUND OF INVENTION

Active-matrix organic light-emitting diode (AMOLED) has advantages of wide color gamut, high contrast, energy saving, foldability, etc., and has strong competitiveness in new generation of displays. By using static driving mode, pixels can be independently adjusted selectively. Therefore, gate on array (GOA) driving circuit is very important for AMOLED. However, some problems will emerge during a manufacturing process, and are difficult to detect. How to find and solve these problems to improve yield has become an urgent problem to be solved.

With a rapid popularization of full screens, screens are required to have higher PPI and higher brightness and chromaticity uniformity. Current display panels adopt bilateral driving, and each side has a dozen GOA traces to realize signal input on each side. However, a unilateral problem cannot be reflected in time through testing when the display panels are driven by a two-sided GOA, or some lines of a unilateral GOA are broken and will not be reflected. Meanwhile, an entire screen can still display normally. This leads to a large number of missed detections, which will affect durability of the display panels.

Therefore, providing a display device that prevents a driving circuit of the display device from missed detections and improves the durability of the display device has become an urgent technical problem to be solved by those skilled in the art.

SUMMARY OF INVENTION

The embodiments of the present disclosure provide a display device and a method of detecting a driving circuit to solve the technical problems of increasing the viewing angle and reducing the production cost.

The present disclosure provides a display device, including:
a panel including a first end and a second end arranged oppositely, and a first side edge and a second side edge arranged oppositely;
a bending area arranged at the second end;
a bonding area arranged at one end of the bending area away from the panel;
a battery testing board arranged on both sides of the bonding area;
a plurality of driving circuit wires including a plurality of first connection wires and a plurality of second connection wires, wherein one end of the first connection wire is connected to the first side edge, and another end of the first connection wire is respectively connected to the bonding area and the battery testing board, one end of the second connection wire is connected to the second side edge, and another end of the second connection wire is respectively connected to the bonding area and the battery testing board; and
a test switch including a first test switch and a second test switch, wherein one end of the first test switch is connected to each of the first connection wires, and another end of the first test switch is respectively connected to the bonding area and the battery testing board, one end of the second test switch is connected to each of the second connection wires, and another end of the second test switch is respectively connected to the bonding area and the battery testing board.

In some embodiments, further including a first fan-out area and a second fan-out area, wherein the first fan-out area is located between the panel and the bending area, and the second fan-out area is located between the bonding area and the bending area.

In some embodiments, the test switch is located between the panel and the first fan-out area.

In some embodiments, the first test switch is a first thin film transistor, the second test switch is a second thin film transistor, a gate of the first thin film transistor is connected to each of the first connection wires, a source of the first thin film transistor is connected to a battery testing board, a drain of the first thin film transistor is connected to the bonding area, a gate of the second thin film transistor is connected to each of the second connection wires, and the source of the first thin film transistor is connected to the battery testing board.

In some embodiments, the battery testing board has a first pin and a second pin, the bonding area has a third pin and a fourth pin, the source of the first thin film transistor is connected to the first pin, the drain of the first thin film transistor is connected to the third pin, the source of the second thin film transistor is connected to the second pin, the drain of the second thin film transistor is connected to the fourth pin.

In some embodiments, the display panel is a flexible display panel.

In some embodiments, the test switch is a thin film transistor switch.

In some embodiments, the bonding area is configured to encapsulate a chip.

In some embodiments, the chip is encapsulated on the panel by an encapsulation.

In some embodiments, the battery testing board and the bonding area are controlled to open or close, to test each of the first connection wires and each of the second connection wires.

The embodiment of the present disclosure also provides a method of detecting a driving circuit, which is applied to a display device, wherein the display device comprises a panel, a bending area, a bonding area, a battery testing board, a plurality of driving circuit wires and a test switch, the panel comprising a first end and a second end arranged oppositely, and a first side edge and a second side edge arranged oppositely, the bending area arranged at the second end, the bonding area arranged at one end of the bending area away from the panel, the battery testing board arranged on both sides of the bonding area, the plurality of driving circuit wire comprising a plurality of first connection wires and a plurality of second connection wires, wherein one end of the first connection wire is connected to the first side edge, and another end of the first connection wire is respectively connected to the bonding area and the battery testing board, one end of the second connection wire is connected to the second side edge, and another end of the second connection wire is respectively connected to the bonding area and the battery testing board, the test switch comprising a first test switch and a second test switch, wherein one end of the first test switch is connected to each of the first connection wires, and another end of the first test switch is respectively connected to the bonding area and the battery testing board, one end of the second test switch is connected to each of the second connection wires, and another end of the second test switch is respectively connected to the bonding area and the battery testing board; the method of detecting the driving circuit comprising the steps:

providing the first pin and the second pin to negative six volts, turning off the third pin and the fourth pin, and turning on the first test switch and the second test switch; and judging a display status of the display screen of the panel, and determining whether the driving circuit is abnormal according to the display screen status.

In some embodiments, further includes the step of:

providing the first pin to negative six volts, providing the second pin to nine volts, turning on the first test switch, and turning off the second test switch; and judging the display status of the display screen of the panel, and determining whether the first connection wires are abnormal according to the display screen status.

In some embodiments, further includes the step of:

providing the first pin to nine volts, providing the second pin to negative six volts, turning off the first test switch, and turning on the second test switch; and judging the display status of the display screen of the panel, and determining whether the second connection wires are abnormal according to the display screen status.

In some embodiments, further includes the step of:

providing the first pin and the second pin to nine volts, turning off the first test switch and the second test switch; and judging the display status of the display screen of the panel, and determining whether the driving circuit is abnormal according to the display screen status.

In some embodiments, further includes the step of:

providing the third pin and the fourth pin to negative six volts, turning off the first pin and the second pin, and turning on the first test switch and the second test switch; and judging the display status of the display screen of the panel, and determining whether the driving circuit is abnormal according to the display screen status.

In some embodiments, the display device further comprising a first fan-out area and a second fan-out area, the first fan-out area located between the panel and the bending area, the second fan-out area located between the bonding area in the bending area.

In some embodiments, the test switch is located between the panel and the first fan-out area.

In some embodiments, the first test switch is a first thin film transistor, the second test switch is a second thin film transistor, a gate of the first thin film transistor is connected to each of the first connection wires, a source of the first thin film transistor is connected to a battery testing board, a drain of the first thin film transistor is connected to the bonding area, a gate of the second thin film transistor is connected to each of the second connection wires, and the source of the first thin film transistor is connected to the battery testing board.

In some embodiments, the battery testing board has a first pin and a second pin, the bonding area has a third pin and a fourth pin, the source of the first thin film transistor is connected to the first pin, the drain of the first thin film transistor is connected to the third pin, the source of the second thin film transistor is connected to the second pin, the drain of the second thin film transistor is connected to the fourth pin.

In some embodiments, the display panel is a flexible display panel.

The display device and the method of detecting the driving circuit provided by the embodiments of the present disclosure include a panel, a bending area, a bonding area, a battery testing board, a plurality of driving circuit wires, and a test switch; the panel comprising a first end and a second end arranged oppositely, and a first side edge and a second side edge arranged oppositely; the bending area arranged at the second end; the bonding area arranged at one end of the bending area away from the panel; the battery testing board arranged on both sides of the bonding area; the plurality of driving circuit wires comprising a plurality of first connection wires and a plurality of second connection wires, wherein one end of the first connection wire is connected to the first side edge, and another end of the first connection wire is respectively connected to the bonding area and the battery testing board, one end of the second connection wire is connected to the second side edge, and another end of the second connection wire is respectively connected to the bonding area and the battery testing board; the test switch comprising a first test switch and a second test switch, wherein one end of the first test switch is connected to each of the first connection wires, and another end of the first test switch is respectively connected to the bonding area and the battery testing board, one end of the second test switch is connected to each of the second connection wires, and another end of the second test switch is respectively connected to the bonding area and the battery testing board. The present disclosure is provided with test switches on both the first connection wire and the second connection wire, so that the wiring on both sides of the driving circuit can be tested, thereby preventing the driving circuit of the display device from missed detections and improving the durability of the display device.

DESCRIPTION OF FIGURES

In order to more clearly describe the technical solutions in the embodiments of the present disclosure, the following will briefly introduce the figures that need to be used in the description of the embodiments. Obviously, the figures in the following description are only some embodiments of the present disclosure. For those skilled in the art, other figures can be obtained based on these figures without inventive step.

DETAILED DESCRIPTION OF PREFERRED EMBODIMENTS

The technical solutions in the embodiments of the present disclosure will be clearly and completely described below in conjunction with the figures in the embodiments of the present disclosure. Obviously, the described embodiments are only a part of the embodiments of the present disclosure, rather than all the embodiments. Based on the embodiments in the present disclosure, all other embodiments obtained by those skilled in the art without inventive step are fall within the protection scope of the present disclosure.

In the description of the present disclosure, it should be understood that the terms of center, longitudinal, transverse, length, width, thickness, upper, lower, front, rear, left, right, vertical, horizontal, top, bottom, inside, outside, clockwise, counterclockwise, etc. or a positional relationship based on orientation or position shown in the figures are only for the convenience of describing the present disclosure and simplifying the description, rather than indicating or implying the device or element referred to must have a specific orientation, structure, or operation. Therefore, it cannot be understood as a limitation of the present disclosure.

The embodiments of the present disclosure provide a display device and a method of detecting a driving circuit. The display device will be described in detail below.

Figure 1:
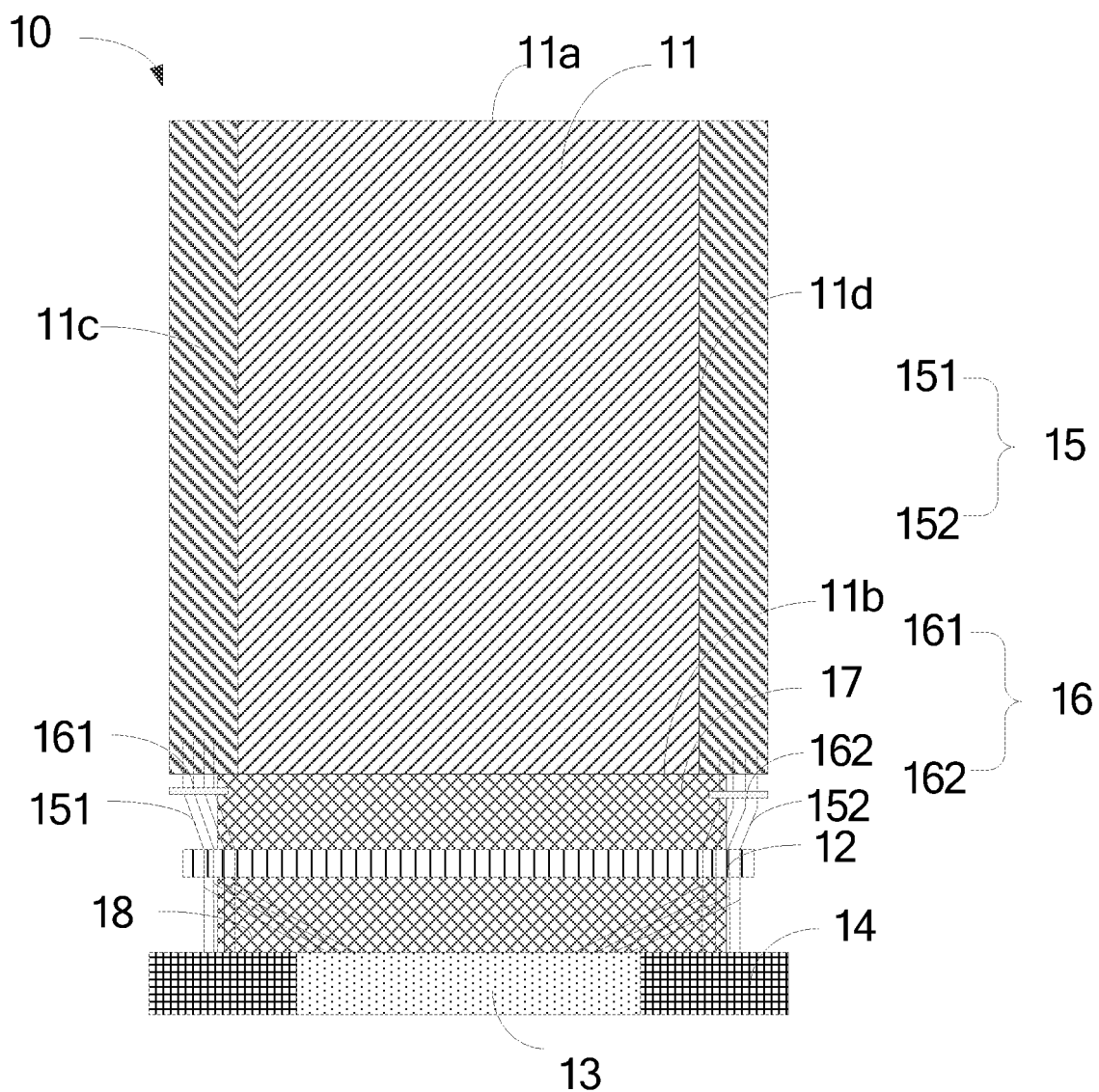
FIG. 1 is a schematic diagram of a structure of a display device provided by one embodiment of the present disclosure.

Please refer to FIG. 1. FIG. 1 is a schematic structural diagram of a display device provided by one embodiment of the present disclosure. The display device 10 includes a panel 11, a bending area 12, a bonding area 13, a battery testing board 14, a plurality of driving circuit wires 15, and a test switch 16. The panel 11 includes a first end 11a and a second end 11b arranged oppositely. A first side edge 11c and a second side edge 11d are arranged oppositely, the bending area 12 is arranged at the second end 11b, the bonding area 13 is arranged at one end of the bending area 12 away from the panel 11, and the battery testing board 14 is arranged on both sides of the bonding area 13. The plurality of driving circuit wires 15 include a plurality of first connection wires 151 and a plurality of second connection wires 152. One end of the first connection wire 151 is connected to the first side edge 11c, and another end of the first connection wire is respectively connected to the bonding area 13 and the battery testing board 14. One end of the second connection wire 152 is connected to the second side edge 11d, and another end of the second connection wire is respectively connected to the bonding area 13 and the battery testing board 14. The test switch 16 includes a first test switch 161 and a second test switch 162. One end of the first test switch 161 is respectively connected to each of the first connection wires 151, and another end of the first connection wire is respectively connected to the bonding area 13 and the battery testing board 14, one end of the of the second test switch 162 is connected to each of the second connection wire 152, and another end of the second test switch 162 is respectively connected to the bonding area 13 and the battery testing board 14.

It should be noted that the first end 11a is an upper end of the panel 11, and the second end 11b is a lower end of the panel 11. In some embodiments, the positions of the first end 11a and the second end 11b can be exchanged. The first side edge 11c is a left side edge of the panel 11, and the second side edge 11d is a right side edge of the panel 11. In some embodiments, the positions of the first side edge 11c and the second side edge 11d can be exchanged.

The panel 11 has a display function. The panel 11 in this embodiment of the present disclosure is a flexible display panel, and the other panel 11 has a display area.

The display device 10 further includes a bending area 12. The driving circuit can be bent to a non-display surface of the panel 11 by the bending area, so that a narrow frame display of the panel 11 can be realized.

The bonding area 13 is a component configured to encapsulate a chip. Specifically, the chip can be encapsulated on the substrate by an encapsulating layer.

The battery testing board 14 is configured to test whether the driving circuit can be energized normally.

The driving circuit is a circuit configured to drive the display of the panel 11. A part of the driving circuit is distributed on both sides of the panel 11, and another part is connected to the bonding area 13 and the battery testing board 14 from both sides of the panel 11.

Specifically, the first connecting wire 151 is a connecting wire connecting the driving circuit on the left side of the panel 11 with the battery testing board 14 and the bonding area 13. It is understood that the first connecting wire 151 may include two, three, or even more wires. In one embodiment of the present disclosure, the specific number of the first connecting wires 151 is not limited. In addition, the second connecting wire 152 is connected to the battery testing board 14 and the bonding area 13 of the right side of the panel 11. It is understood that the second connecting wire 152 may include two, three, or even more wires. In this embodiment of the present disclosure, the specific number of the second connecting wires 152 is not limited.

The test switch 16 may be the same type of switch. Specifically, the test switch 16 may be a thin film transistor switch. In addition, there may be several first test switches 161, and each first connection wire 151 is connected to one first test switch 161. Correspondingly, there may also be several second test switches 162, and each second connection wire 152 is connected to one second test switch 162. At the same time, the first test switch 161 and the second test switch 162 are also connected to the battery testing board 14 and the bonding area 13. By controlling turning on or turning off of the battery testing board 14 and the bonding area 13, each of the first connection wire 151 and the second connection can be tested. In this way, the possibility of missed detection can be prevented, and a durability of the display device 10 can be improved.

The display device 10 further includes a first fan-out area 17 and a second fan-out area 18. The first fan-out area 17 is located between the panel 11 and the bending area 12, and the second fan-out area 18 is located between the bonding area 13 and the bending area 12.

It can be understood that the first fan-out area 17 and the second fan-out area 18 are used for wiring design, and the first fan-out area 17 and the second fan-out area are connected to the panel 11, the bending area 12, and the bonding area 13.

The test switch 16 is located between the panel 11 and the first fan-out area 17. This prevents the test switch 16 from being too close to the bonding area 13 and the battery testing board 14, thereby facilitating the layout of the test switch 16, and at the same time, ensuring that the test switch 16 is connected to each connection wire, thereby improving the detection effect.

The first test switch 161 is a first thin film transistor, the second test switch 162 is a second thin film transistor, a gate of the first thin film transistor is connected to each of the first connection wires 151, a source of the first thin film transistor is connected to the battery testing board 14, a drain of the first thin film transistor is connected to the bonding area 13, and a gate of the second thin film transistor is connected to each of second connection wires 152, and the source of the first thin film transistor is connected to the battery testing board.

It should be noted that the first test switch 161 may also adopt other types of switches, such as a knife switch, a triode, and the like. It can be understood that both the first test switch 161 and the second test switch 162 in the embodiment of the present disclosure use thin film transistors as switches, so that each of connection wires can be tested at a faster speed.

Figure 2:
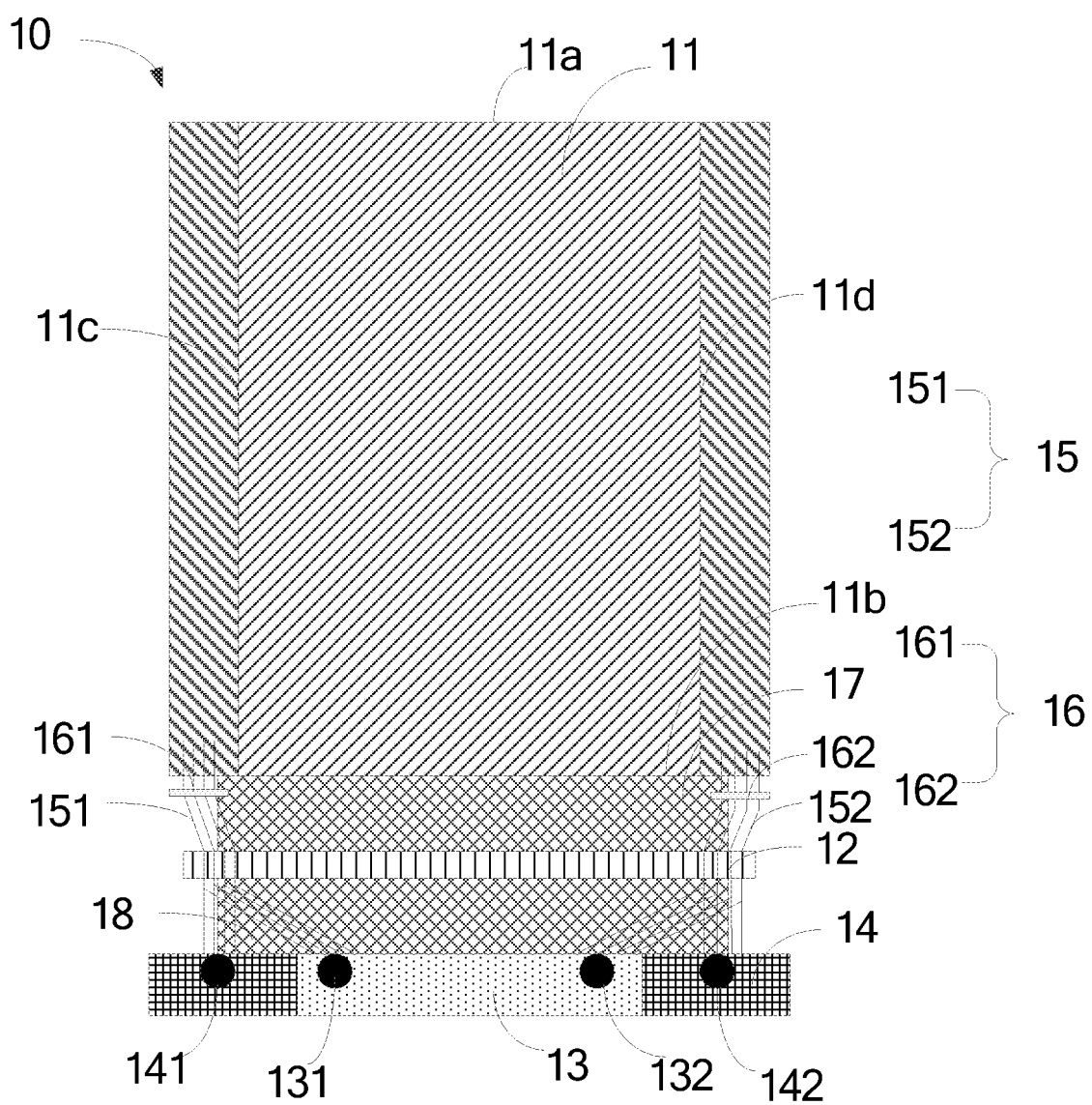
FIG. 2 is a schematic structural diagram of another display device provided by one embodiment of the present disclosure.

Please refer to FIG. 2. FIG. 2 is a schematic structural diagram of another display device provided by one embodiment of the present disclosure. The battery testing board has a first pin 141 and a second pin 142, the bonding area 13 has a third pin 131 and a fourth pin 132, the source of the first thin film transistor is connected to the first pin 141, the drain of the first thin film transistor is connected to the third pin 131, a source of the second thin film transistor is connected to the second pin 142, and a drain of the second thin film transistor is connected to the fourth pin 132.

It should be noted that in the present disclosure, multiple pins may also be arranged on the battery testing board 14, and multiple pins may also be arranged on the bonding area 13.

The display device 10 provided by one embodiment of the present disclosure includes a panel 11, a bending area 12, a bonding area 13, a battery testing board 14, a plurality of driving circuit wires 15, and a plurality of test switches 16; the panel 11 including a first end 11*a* and a second end 11*b* arranged oppositely, and a first side edge 11*c* and a second side edge 11*d* arranged oppositely; the bending area 12 arranged at the second end 11*b*; the bonding area 13 arranged at one end of the bending area 12 away from the panel 11; the battery testing board 14 arranged on both sides of the bonding area 13; the plurality of driving circuit wires 15 including a plurality of first connection wires 151 and a plurality of second connection wires 152, wherein one end of the first connection wire 151 is connected to the first side edge 11*c*, and another end of the first connection wire 151 is respectively connected to the bonding area 13 and the battery testing board 14, one end of the second connection wire 152 is connected to the second side edge 11*d*, and another end of the second connection wire 152 is respectively connected to the bonding area 13 and the battery testing board 14; the plurality of test switches 16 including at least one first test switch 161 and at least one second test switch 162, wherein one end of the first test switch 161 is connected to each of the first connection wires 151, and another end of the first test switch 161 is respectively connected to the bonding area 13 and the battery testing board 14, one end of the second connection wire 152 is connected to each of the second connection wires 152, and another end of the second test switch 162 is respectively connected to the bonding area 13 and the battery testing board 14. The present disclosure is provided with test switches 16 on both the first connection wire 151 and the second connection wire 152, so that the wiring on both sides of the driving circuit can be tested, thereby preventing the driving circuit of the display device 10 from missed detections and improving the durability of the display device 10.

Figure 3:
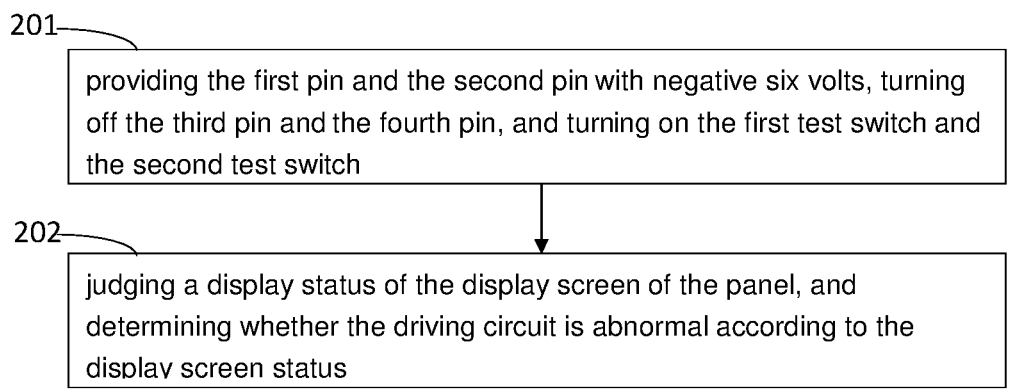
FIG. 3 is a schematic flowchart of a method of detecting a driving circuit provided by one embodiment of the present disclosure.

Please refer to FIG. 3, FIG. 3 is a schematic flowchart of a method of detecting a driving circuit provided by one embodiment of the present disclosure. One embodiment of the present disclosure provides the method of detecting the driving circuit, which is applied to the display device described in the above embodiment, and includes following steps:

201, providing the first pin and the second pin with negative six volts, turning off the third pin and the fourth pin, and turning on the first test switch and the second test switch.

202, judging a display status of the display screen of the panel, and determining whether the driving circuit is abnormal according to the display screen status.

It should be noted that the display device has been described in detail in the above embodiments, and the display device in the embodiment will not be described in detail.

In addition, the display status can be artificially detected by detecting to see if the panel screen is displayed normally. If it is confirmed that the display condition of the panel is normal by the detection, it is judged that there is no abnormality in the driving circuit. If it is judged that the display condition of the panel is abnormal by the detection, it is judged that the driving circuit is abnormal, then the driving circuit needs to be repaired or fixed.

In some embodiments, the method of detecting the driving circuit further includes:

(1) Providing the first pin with negative six volts, providing the second pin with nine volts, turning on the first test switch, and turning off the second test switch.

(2) Judging a display status of the display screen of the panel, and determining whether the first connection wires are abnormal according to the display screen status.

It should be noted that the display status can be artificially detected by detecting whether the panel screen is displayed normally. If the display of the panel is judged normal by the detection, it is judged that the first connection wire is not abnormal. If it is detected that the display of the panel is abnormal, it is judged that the first connecting wire is abnormal. The first connection wire needs to be repaired or fixed.

In some embodiments, the method of detecting the driving circuit further includes:

(1) Providing the first pin with nine volts, providing the second pin with negative six volts, turning off the first test switch, and turning on the second test switch.

(2) Judging a display status of the display screen of the panel, and determining whether the second connection wires are abnormal according to the display screen status.

It should be noted that the display status can be artificially detected by detecting whether the panel screen is displayed normally. If the display of the panel is detected normal by the detection, it is judged that the second connection wire is not abnormal. If it is judged that the display status of the panel is abnormal, it is judged that the second connecting wire is abnormal. The second connection wire needs to be repaired or fixed.

In some embodiments, the method of detecting the driving circuit further includes:

(1) Providing the first pin and the second pin with nine volts, turning off the first test switch and the second test switch.

(2) Judging a display status of the display screen of the panel, and determining whether the driving circuit is abnormal according to the display screen status.

It should be noted that the display status can be artificially detected by detecting whether the panel screen is displayed. If judged that the panel screen of the panel displayed, it is determined that the driving circuit is abnormal. The driving circuit needs to be repaired or fixed. If judged that the display screen of the panel not displayed and there is no power, it is determined that there is no abnormality in the driving circuit.

In some embodiments, the method of detecting the driving circuit further includes:

(1) Providing the third pin and the fourth pin with negative six volts, turning off the first pin and the second pin, and turning on the first test switch and the second test switch.

(2) Judging a display status of the display screen of the panel, and determining whether the driving circuit is abnormal according to the display screen status.

It should be noted that the display status can be artificially checked by checking whether the panel screen is displayed normally. If the display status of the panel is determined to be normal by the detection, it is judged that there is no abnormality in the driving circuit. If it is judged that the display status of the panel is abnormal by the detection, it is judged that the driving circuit is abnormal. The driving circuit needs to be fixed or repaired.

The display device and the method of detecting the driving circuit provided by the embodiments of the present disclosure are described in detail above. Specific examples are used to illustrate the principles and implementations of the present disclosure. The description of the above embodiments is only used to help understand the present disclosure. At the same time, for those skilled in the art, according to the idea of the present disclosure, there will be changes in the specific implementation and the scope of application. In summary, the content of this specification should not be construed as a limitation to the present disclosure.

What is claimed is:

1. A display device, comprising:
    a panel comprising a first end and a second end arranged oppositely, and a first side edge and a second side edge arranged oppositely;
    a bending area arranged at the second end;
    a bonding area arranged at one end of the bending area away from the panel;
    a battery testing board arranged on both sides of the bonding area;
    a plurality of driving circuit wires comprising a plurality of first connection wires and a plurality of second connection wires, wherein one end of the first connection wires is connected to the first side edge, and another end of the first connection wires is respectively connected to the bonding area and the battery testing board, one end of the second connection wires is connected to the second side edge, and another end of the second connection wires is respectively connected to the bonding area and the battery testing board; and
    a plurality of test switches comprising at least one first test switch and at least one second test switch, wherein one end of the first test switch is connected to each of the first connection wires, and another end of the first test switch is respectively connected to the bonding area and the battery testing board, one end of the second test switch is connected to each of the second connection wires, and another end of the second test switch is respectively connected to the bonding area and the battery testing board.

2. The display device as claimed in claim 1, further comprising a first fan-out area and a second fan-out area, wherein the first fan-out area is located between the panel and the bending area, and the second fan-out area is located between the bonding area and the bending area.

3. The display device as claimed in claim 2, wherein the test switches are located between the panel and the first fan-out area.

4. The display device as claimed in claim 1, wherein the first test switch is a first thin film transistor, the second test switch is a second thin film transistor, a gate of the first thin film transistor is connected to each of the first connection wires, a source of the first thin film transistor is connected to the battery testing board, a drain of the first thin film transistor is connected to the bonding area, a gate of the second thin film transistor is connected to each of the second connection wires, and the source of the first thin film transistor is connected to the battery testing board.

5. The display device as claimed in claim 4, wherein the battery testing board comprises a first pin and a second pin, the bonding area comprises a third pin and a fourth pin, the source of the first thin film transistor is connected to the first pin, the drain of the first thin film transistor is connected to the third pin, a source of the second thin film transistor is connected to the second pin, and a drain of the second thin film transistor is connected to the fourth pin.

6. The display device as claimed in claim 1, wherein the panel is a flexible display panel.

7. The display device as claimed in claim 1, wherein the test switches are thin film transistor switches.

8. The display device as claimed in claim 1, wherein the bonding area is configured to encapsulate a chip.

9. The display device as claimed in claim 8, wherein the chip is encapsulated on the panel by encapsulation.

10. The display device as claimed in claim 8, wherein the battery testing board and the bonding area are controlled to open or close, to test each of the first connection wires and each of the second connection wires.

11. A method of detecting a driving circuit, which is applied to a display device, wherein the display device comprises a panel, a bending area, a bonding area, a battery testing board, a plurality of driving circuit wires, and a plurality of test switches;
    wherein the panel comprises a first end and a second end arranged oppositely, and a first side edge and a second side edge arranged oppositely, the bending area is arranged at the second end, the bonding area is arranged at one end of the bending area away from the panel, the battery testing board is arranged on both sides of the bonding area, the plurality of driving circuit wires comprise a plurality of first connection wires and a plurality of second connection wires, wherein one end of the first connection wires is connected to the first side edge, and another end of the first connection wires is respectively connected to the bonding area and the battery testing board, one end of the second connection wires is connected to the second side edge, and another end of the second connection wires is respectively connected to the bonding area and the battery testing board, the plurality of test switches comprise at least one first test switch and at least one second test switch, wherein one end of the first test switch is connected to each of the first connection wires, and another end of the first test switch is respectively connected to the bonding area and the battery testing board, one end of the second test switch is connected to each of the second connection wires, and another end of the second test switch is respectively connected to the bonding area and the battery testing board; and
    wherein the method of detecting the driving circuit comprises following steps:
    providing a first pin and a second pin with negative six volts, turning off a third pin and a fourth pin, and turning on the first test switch and the second test switch; and
    judging a display status of the display screen of the panel, and determining whether the driving circuit is abnormal according to the display screen status.

12. The method of detecting the driving circuit as claimed in claim 11, further comprising following steps:

providing the first pin with negative six volts, providing the second pin with nine volts, turning on the first test switch, and turning off the second test switch; and judging the display status of the display screen of the panel, and determining whether the first connection wires are abnormal according to the display screen status.

13. The method of detecting the driving circuit as claimed in claim 11, further comprising following steps:

providing the first pin with nine volts, providing the second pin with negative six volts, turning off the first test switch, and turning on the second test switch; and judging the display status of the display screen of the panel, and determining whether the second connection wires are abnormal according to the display screen status.

14. The method of detecting the driving circuit as claimed in claim 11, further comprising following steps:

providing the first pin and the second pin with nine volts, turning off the first test switch and the second test switch; and judging the display status of the display screen of the panel, and determining whether the driving circuit is abnormal according to the display screen status.

15. The method of detecting the driving circuit as claimed in claim 11, further comprising following steps:

providing the third pin and the fourth pin with negative six volts, turning off the first pin and the second pin, and turning on the first test switch and the second test switch; and judging the display status of the display screen of the panel, and determining whether the driving circuit is abnormal according to the display screen status.

16. The method of detecting the driving circuit as claimed in claim 11, wherein the display device further comprises a first fan-out area and a second fan-out area, the first fan-out area is located between the panel and the bending area, and the second fan-out area is located between the bonding area in the bending area.

17. The method of detecting the driving circuit as claimed in claim 16, wherein the test switches are located between the panel and the first fan-out area.

18. The method of detecting the driving circuit as claimed in claim 11, wherein the first test switch is a first thin film transistor, the second test switch is a second thin film transistor, a gate of the first thin film transistor is connected to each of the first connection wires, a source of the first thin film transistor is connected to the battery testing board, a drain of the first thin film transistor is connected to the bonding area, a gate of the second thin film transistor is connected to each of the second connection wires, and the source of the first thin film transistor is connected to the battery testing board.

19. The method of detecting the driving circuit as claimed in claim 11, wherein the battery testing board has the first pin and the second pin, the bonding area has the third pin and the fourth pin, the source of the first thin film transistor is connected to the first pin, the drain of the first thin film transistor is connected to the third pin, a source of the second thin film transistor is connected to the second pin, and a drain of the second thin film transistor is connected to the fourth pin.

20. The method of detecting the driving circuit as claimed in claim 11, wherein the panel is a flexible display panel.

* * * * *